(12) United States Patent
Cai

(10) Patent No.: US 10,573,704 B2
(45) Date of Patent: Feb. 25, 2020

(54) FLEXIBLE SUBSTRATE WITH VIA HOLE FORMED IN INSULATION LAYER, METHOD FOR MANUFACTURING FLEXIBLE SUBSTRATE, AND DISPLAY DEVICE

(71) Applicant: BOE TECHNOLOGY GROUP CO., LTD., Beijing (CN)

(72) Inventor: Peng Cai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 833 days.

(21) Appl. No.: 15/021,604

(22) PCT Filed: Aug. 17, 2015

(86) PCT No.: PCT/CN2015/087203
§ 371 (c)(1),
(2) Date: Mar. 11, 2016

(87) PCT Pub. No.: WO2016/165249
PCT Pub. Date: Oct. 20, 2016

(65) Prior Publication Data
US 2017/0069701 A1    Mar. 9, 2017

(30) Foreign Application Priority Data
Apr. 16, 2015   (CN) .......................... 2015 1 0181051

(51) Int. Cl.
*H01L 27/13* (2006.01)
*H01L 27/32* (2006.01)
(Continued)

(52) U.S. Cl.
CPC ...... *H01L 27/3276* (2013.01); *H01L 27/3246* (2013.01); *H01L 27/3258* (2013.01);
(Continued)

(58) Field of Classification Search
CPC ............. H01L 27/3246; H01L 27/3258; H01L 27/1255
See application file for complete search history.

(56) References Cited

U.S. PATENT DOCUMENTS 7,915,821 B2   3/2011   Kang
8,698,134 B2   4/2014   Kim et al.
(Continued)

FOREIGN PATENT DOCUMENTS

CN   101034687 A  *  9/2007  ............. H01L 23/00
CN   102790094 A    11/2012
(Continued)

OTHER PUBLICATIONS

Machine translation of CN101034687A Abstract.*
(Continued)

*Primary Examiner* — Daniel Whalen
*Assistant Examiner* — Suberr L Chi
(74) *Attorney, Agent, or Firm* — Harness, Dickey & Pierce, P.L.C.

(57) ABSTRACT

The present disclosure relates to a technical field of displaying, and provides a flexible substrate, a method for manufacturing the flexible substrate and a display device including the flexible substrate. The flexible substrate includes: a flexible base; and a plurality of insulation layers formed on the flexible base, wherein a via hole is formed in at least one of the insulation layers and filled with an organic material.

20 Claims, 2 Drawing Sheets

(51) Int. Cl.
   *H01L 51/52* (2006.01)
   *H01L 51/00* (2006.01)
   *H01L 51/56* (2006.01)
   *H01L 27/12* (2006.01)

(52) U.S. Cl.
   CPC ...... *H01L 27/3262* (2013.01); *H01L 27/3265* (2013.01); *H01L 51/0097* (2013.01); *H01L 51/5253* (2013.01); *H01L 51/5256* (2013.01); *H01L 51/56* (2013.01); *H01L 27/124* (2013.01); *H01L 27/1218* (2013.01); *H01L 27/1248* (2013.01); *H01L 27/1255* (2013.01); *H01L 2227/323* (2013.01); *H01L 2251/5338* (2013.01); *Y02E 10/549* (2013.01)

(56) References Cited

U.S. PATENT DOCUMENTS

| | | | |
|---|---|---|---|
| 8,913,206 B2 | 12/2014 | Masuda et al. | |
| 2012/0074388 A1* | 3/2012 | Park | H01L 27/3258 257/40 |
| 2015/0287747 A1 | 10/2015 | Cheng et al. | |
| 2016/0111666 A1* | 4/2016 | Jung | H01L 51/0097 257/40 |
| 2016/0233280 A1* | 8/2016 | Cheng | H01L 27/1218 |

FOREIGN PATENT DOCUMENTS

| | | |
|---|---|---|
| CN | 103545320 A | 1/2014 |
| CN | 103545321 A | 1/2014 |
| CN | 103681738 A | 3/2014 |
| CN | 104752365 A | 7/2015 |
| CN | 104795403 A | 7/2015 |
| JP | 2006114499 A | 4/2006 |

OTHER PUBLICATIONS

First Chinese Office Action regarding Application No. 201510181051.3 dated Dec. 7, 2015. English translation provided by Dragon Intellectual Property Law Firm.

Written Opinion of the International Searching Authority for International Application No. PCT/CN2015/087203.

* cited by examiner

FLEXIBLE SUBSTRATE WITH VIA HOLE FORMED IN INSULATION LAYER, METHOD FOR MANUFACTURING FLEXIBLE SUBSTRATE, AND DISPLAY DEVICE

CROSS REFERENCE OF RELATED APPLICATION APPLICATIONS

This application is the U.S. national phase of PCT Application No. PCT/CN2015/087203 filed on Aug. 17, 2015, which claims a priority of the Chinese Patent Application No. 201510181051.3 filed on Apr. 16, 2015, the disclosures of which are incorporated in their entirety by reference herein.

TECHNICAL FIELD

The present disclosure relates to a technical field of displaying, and in particular to a flexible substrate, a method for manufacturing the flexible substrate and a display apparatus including the flexible substrate.

BACKGROUND

A flexible display device is made based on a flexible base material. The flexible display device has advantages of being rollable, wide view angle, and good portability, and thus has a broad application prospect and favorable market potential in many display application fields, such as portable products.

Conventionally, an array substrate in the flexible display device includes an insulation layer, such as an inorganic buffer layer, a gate insulation layer, an inter-layer insulation layer and a passivation layer. The above insulation layer is usually made of a material of SiNx or SiOx which has a poor tenacity. Thus, the insulation layer is prone to be broken when the flexible display device is being bended, and thereby the reliability of thin film transistors (TFTs) and storage capacitors on the array substrate of the flexible display device is degraded or even damaged. As a result, a reliability of the display device is dissatisfying.

SUMMARY

An object of the present disclosure is to provide a flexible substrate, a method for manufacturing the flexible substrate and a display device including the flexible substrate, wherein the insulation layer of the flexible substrate is not prone to be broken, and thus the flexible substrate is of high reliability and good bendability.

In one aspect, the present disclosure provide in some embodiments a flexible substrate, including:
a flexible base; and
a plurality of insulation layers, formed on the flexible base,
wherein a via hole is formed in at least one of the insulation layers and filled with an organic material.

In the above flexible substrate, the via hole penetrates through at least one of the insulation layers in the thickness direction and filled with an organic material. As a result, a stress caused by bending the flexible substrate may be absorbed by the organic material in the via hole, so that the stress generated in the process of bending the insulation layer may be reduced, and the insulation layer is prevented from being broken by a undue stress. Thus, the flexible substrate is of high reliability and good bendability.

Alternatively, the flexible substrate further includes: organic material layers, formed on the insulation layer in which the via hole is formed, wherein the via hole is filled with the organic material layers.

Alternatively, the flexible substrate further includes: a functional unit, formed on the flexible base and including a thin film transistor (TFT) and a storage capacitor which is electrically connected to the TFT, wherein the via hole is arranged in the plurality of insulation layers arranged around the functional unit.

Alternatively, the via hole is arranged in the plurality of insulation layers arranged between the TFT and the storage capacitor.

Alternatively, the plurality of insulation layers at least includes an inorganic buffer layer, a gate insulation layer and a passivation layer which are overlapped one on another, and the passivation layer is arranged to be farthest to the flexible base among the plurality of insulation layers.

Alternatively, each of the via hole arranged around the functional unit and the via hole arranged between the TFT and the storage capacitor is a first via hole penetrating through each of the plurality of insulation layers.

Alternatively, the passivation layer is formed on the functional unit, and a second via hole penetrates through the passivation layer in a thickness direction and is arranged in a portion of the passivation layer corresponding to the functional unit.

Alternatively, the flexible substrate further includes: a planarization layer, formed on the passivation layer, wherein both the first via hole and the second via hole are filled with the passivation layer.

Alternatively, the flexible substrate further includes a pixel definition layer and a light-emitting unit, formed on the planarization layer, wherein the light-emitting unit includes an anode layer, a light-emitting layer and a cathode layer which are overlapped one on another, the pixel definition layer is arranged around the anode layer and the light-emitting layer, and the light-emitting layer includes at least one organic light-emitting element.

Alternatively, a third via hole is arranged in the planarization layer on a region which does not correspond to the anode layer, and filled with the pixel definition layer.

Alternatively, both the functional unit and the first via hole are arranged on a region corresponding to the anode layer.

Alternatively, the plurality of insulation layers further includes an inter-layer insulation layer arranged between the gate insulation layer and the passivation layer.

Alternatively, the flexible substrate further includes: a packaging layer, formed on the light-emitting unit and formed by arranging organic layers and inorganic layers alternately.

Alternatively, the flexible substrate further includes: an organic buffer layer, arranged between the flexible base and the plurality of insulation layers.

Alternatively, the via hole is of a circular, elliptical or polygonal shape.

Alternatively, the flexible base is made of one or more materials selected from the group consisting of polyimide, polycarbonate, polyacrylate, polyetherimide, polyethersulfone, polyethylene terephthalate, and polyethylene naphthalate.

In another aspect, the present disclosure provides in some embodiment a method for manufacturing the flexible substrate according to any one of the above solutions, including:
forming at least one insulation layer on the flexible base; and forming a via hole in the at least one insulation layer, and filling the via hole with an organic material.

In another aspect, the present disclosure provides in some embodiments a display device including the flexible substrate according to any one of the above solutions.

DETAILED DESCRIPTION

In the following, it is clearly and completely described the technical solutions according to the embodiments of the present disclosure. It is obvious that the described embodiments are merely some of all the embodiments of the present disclosure instead of all the embodiments. All of other embodiment that those skilled in the art may be implemented based on the embodiments in the present disclosure without creative work should also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
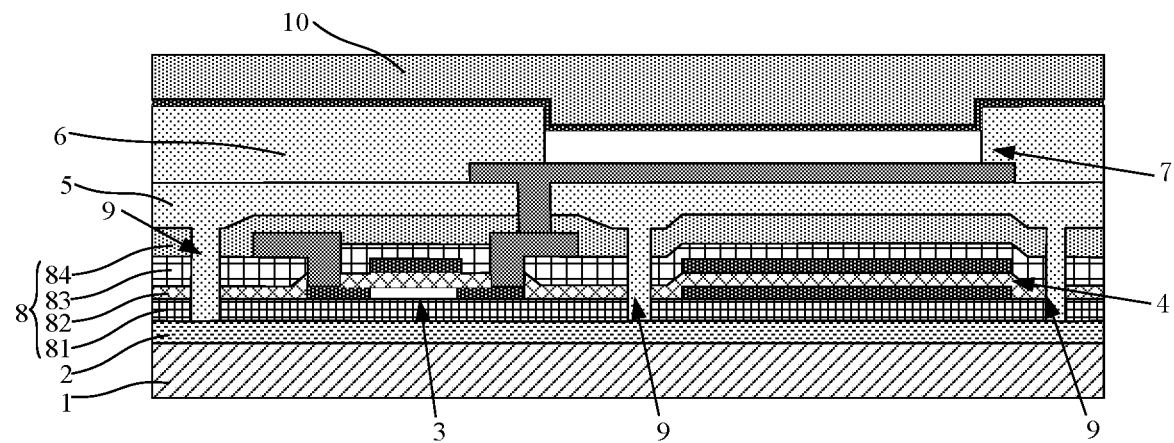
FIG. 1 is a schematic view showing a flexible substrate according to an embodiment of the present disclosure.
Figure 2:
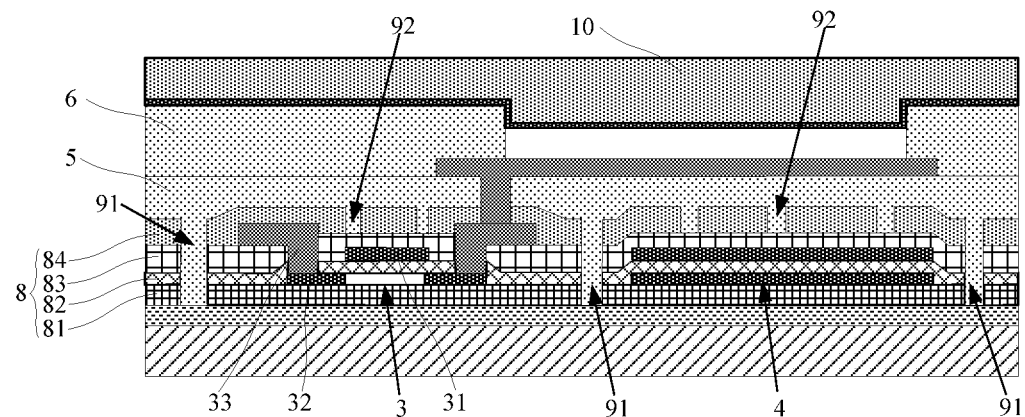
FIG. 2 is a schematic view showing another flexible substrate according to an embodiment of the present disclosure.
Figure 3:
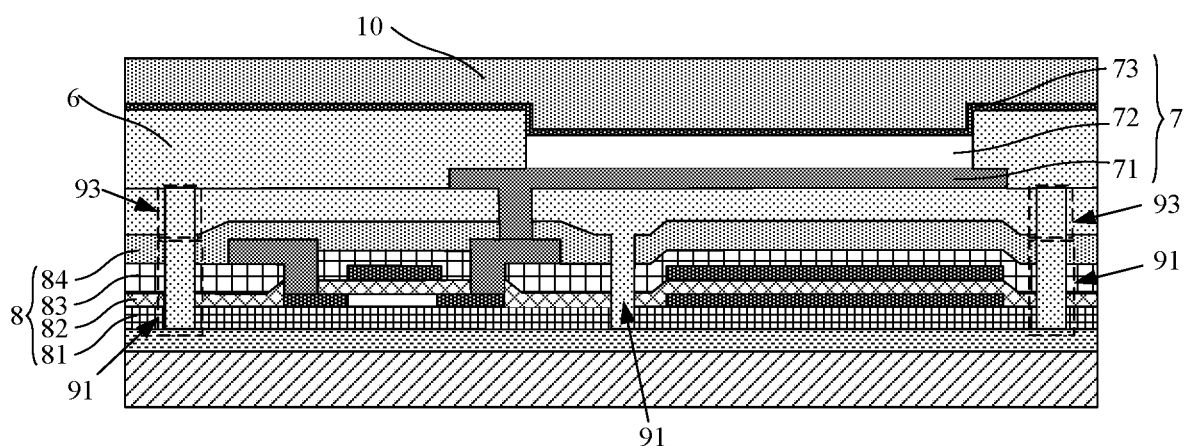
FIG. 3 is a schematic view showing yet another flexible substrate according to an embodiment of the present disclosure.

In an embodiment of the present disclosure, as illustrated in FIGS. 1, 2 and 3, the present disclosure provides a flexible substrate, including:

a flexible base 1; and a plurality of insulation layers 8, formed on the flexible base 1, wherein a via hole 9 is formed in at least one of the insulation layers and filled with an organic material.

In the above flexible substrate, the via hole penetrates through at least one of the insulation layers 8 in the thickness direction and filled with the flexible organic material. Thus, a stress caused by bending the flexible substrate may be absorbed by the organic material in the via hole, so that the stress generated in the process of bending the flexible substrate may be reduced, and the insulation layer is prevented from being broken by the undue stress. As a result, the flexible substrate is of high reliability and good bendability.

In an embodiment, the flexible substrate further includes: organic material layers, formed on the insulation layer in which the via hole is formed, wherein the via hole may be filled with the organic material layers.

In an embodiment, as illustrated in FIGS. 1, 2 and 3, the flexible substrate may include: a functional unit, formed on the flexible base 1 and including a TFT 3 and a storage capacitor 4 which is electrically connected to the TFT 3. Alternatively, the via hole may be arranged in the plurality of insulation layers 8 arranged around the functional unit.

In a further embodiment based on the above embodiment, as illustrated in FIGS. 1, 2 and 3, the via hole is further arranged in the plurality of insulation layers 8 arranged between the TFT 3 and the storage capacitor 4.

In a further embodiment based on the above embodiment, as illustrated in FIGS. 1, 2 and 3, the plurality of insulation layers 8 may include an inorganic buffer layer formed on the flexible base 1, wherein the TFT 3 and the storage capacitor 4 are formed on the inorganic buffer layer 81.

The TFT 3 may be of either a bottom-gate configuration or a top-gate configuration, and a configuration of the plurality of insulation layers 8 may be associated with a configuration of the TFT 3. In particular, when the TFT 3 is of the bottom-gate configuration, in addition to the inorganic buffer layer 81, the plurality of insulation layers 8 may further include a gate insulation layer 82 formed between a gate electrode 31 and an active layer 32 of the TFT 3. Meanwhile, the gate insulation layer 82 may be further arranged between two electrodes of the storage capacitor 4 and function as a dielectric layer of the storage capacitor 4. In addition, the plurality of insulation layers 8 may further include a passivation layer 84 formed on the TFT 3 and the storage capacitor 4.

As illustrated in FIGS. 1, 2 and 3, when the TFT 3 is of the top-gate configuration, in addition to the inorganic buffer layer 81, the gate insulation layer 82 and the passivation layer 84, the plurality of insulation layers 8 may further include an inter-layer insulation layer 83 formed between the gate electrode 31 and a source-drain electrode 33 of the TFT 3.

In a further embodiment based on the above embodiment, each of the via hole arranged in the plurality of insulation layers 8 around the functional unit and the via hole arranged in the plurality of insulation layers 8 between the TFT 3 and the storage capacitor 4 may be a first via hole 91 penetrating through each of the plurality of insulation layers 8.

For example, as illustrated in FIGS. 1 and 2, when the TFT 3 in the flexible substrate is of the top-gate configuration, in a region around the TFT 3 and an a region between the TFT 3 and the storage capacitor 4, the first via hole 91 is formed in and penetrates through each of the inorganic buffer layer 81, a gate insulation layer 82, the inter-layer insulation layer 83 and the passivation layer 84, and the via hole 91 is filled with the organic material. The first via hole 91 may be formed by a single etching process subsequent to form the top layer, i.e. the passivation layer 84 of the plurality of insulation layers 8, and the first via hole 91 may be filled with the flexible organic material by a single filling process. The organic material filled in the first via hole 91 may function to absorb the stress caused by bending the flexible substrate, so as to prevent the insulation layers of the flexible substrate from being broken by undue stress. As a result, the flexible substrate is of higher reliability and better bendability.

In a further embodiment based on the above embodiment, as illustrated in FIG. 2, a second via hole 92 may penetrate through the passivation layer 84 in a thickness direction and be arranged in a portion of the passivation layer 84 corresponding to the functional unit. The second via hole 92 is arranged above the TFT 3 and the storage capacitor 4, and thus the organic material filled in the second via hole 92 may absorb the stress, so as to counteract the stress in the TFT 3 and the storage capacitor 4 during the bending process. Alternatively, a via hole may be further arranged in a portion of the inorganic layer 81 below the TFT 3 and the storage capacitor 4. When the via holes are arranged in the region of the passivation layer 84 above the TFT 3 and the storage capacitor 4 and the region of the inorganic layer 81 below the TFT 3 and the storage capacitor 4, and the via holes are filled with the organic material, the stress caused by bending the flexible substrate may be absorbed by the organic material in the region above and the region below the TFT 3 and the storage capacitor 4, so as to counteract the stress in the TFT 3 and the storage capacitor 4, and prevent the inorganic buffer layer 81 and the passivation layer 84 from being broken by undue stress. Thus, the flexible substrate is of high reliability and good bendability.

In a further embodiment based on the above embodiment, as illustrated in FIGS. 1 and 2, the flexible substrate may further include: a planarization layer 5 formed on the passivation layer 84, wherein both the first via hole 91 and the second via hole 92 may be filled with the passivation layer. The planarization layer 5 may be formed by the flexible organic material. The first via hole 91 and the second via hole 92 may be filled with the material of the planarization layer, so as to absorb the stress. In a process of manufacturing the flexible substrate, the first via hole 91 and the second via hole 92 may be formed by a single developing process subsequent to form the plurality of insulation layers 8, and filled up with the material of the planarization layer 5 during forming the planarization layer 5, so as to simplify the step of forming and filling the first via hole 91 and the second via hole 92.

In a further embodiment based on the above embodiment, as illustrated in FIG. 3, the flexible substrate may further include a pixel definition layer 6 and a light-emitting unit 7 formed on the planarization layer 5. The light-emitting unit 7 may include an anode layer 71, a light-emitting layer 72 and a cathode layer 73 which are overlapped one on another, and the pixel definition layer 6 may be arranged around the anode layer 71 and the light-emitting layer 72. The light-emitting layer 72 may include at least one organic light-emitting element.

In a further embodiment based on the above embodiment, as illustrated in FIG. 3, a third via hole 93 is arranged in and penetrates through the planarization layer 5 in the thickness direction on a region which does not correspond to the anode layer 71, and filled with the pixel definition layer 6. Alternatively, the functional units and a part of the first via holes 91 each may be arranged on a region corresponding to the anode layer 71, an orthographic projection of each of the third via holes 93 on the flexible base completely overlaps with an orthographic projection of a corresponding one of other part of the first via holes 91 on the flexible base, the other part of the first via holes 91 being on the region which does not correspond to the anode layer 71. The pixel definition layer 6 may be formed by a flexible organic material, and the third via holes 93 and the other part of the first via holes 91 may be filled with the material of the pixel definition layer 6. As a result, a stress caused by bending the flexible substrate may be absorbed by the material of the pixel definition layer 6 in the third via holes 93 and the other part of the first via holes 91, so as to reduce the stress on the region which does not correspond to the anode layer 71 during the process of bending the flexible substrate, and thus both the reliability and the bendability of the flexible substrate are improved.

In a further embodiment based on the above embodiment, each of the via holes may be of a circular, elliptical or polygonal shape. In particular, each of the first via hole 91, the second via hole 92 and the third via hole 93 may be of the circular, the elliptical or the polygonal shape. Of course, the shape of each of the above via holes is not limited thereto, and may alternatively be any other shape.

In a further embodiment based on the above embodiment, as illustrated in FIGS. 1, 2 and 3, the flexible substrate may further include an organic buffer layer 2 arranged between the flexible base 1 and the plurality of insulation layers 8. The organic buffer layer 2 may also absorb the stress caused by bending the flexible substrate, so as to improve the bendability of the flexible substrate.

In a further embodiment based on the above embodiment, as illustrated in FIGS. 1, 2 and 3, the flexible substrate may further include a packaging layer 10 formed on the light-emitting unit 7 and formed by depositing at least one inorganic layer and at least one organic layer alternately. The organic layer being alternately deposited with the inorganic layer may absorb the stress caused by bending the display panel, so as to prevent the inorganic layer in the packaging layer 10 from being broken by undue stress.

In a further embodiment based on the above embodiment, the flexible base 1 may be made of one or more materials selected from the group consisting of polyimide, polycarbonate, polyacrylate, polyetherimide, polyethersulfone, polyethylene terephthalate, and polyethylene naphthalate.

Figure 4:
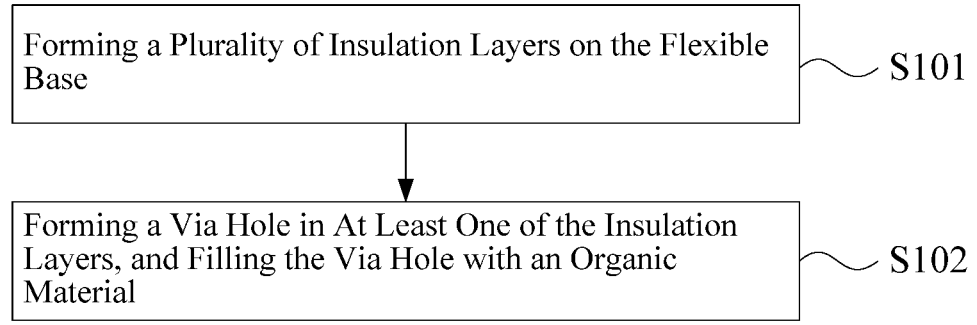
FIG. 4 is a schematic view showing a method for manufacturing a flexible substrate according to an embodiment of the present disclosure.

In an embodiment, as illustrated in FIG. 4, the present disclosure further provides a method for manufacturing the flexible substrate, including steps of:

step S101: forming a plurality of insulation layers 8 on the flexible base 1; and step S102: forming a via hole in at least one insulation layer, and filling the via hole with an organic material.

In the above method for manufacturing the flexible substrate, in step S102, the via hole penetrates through at least one of the insulation layers in the thickness direction and filled with an organic material. As a result, a stress caused by bending the flexible substrate may be absorbed by the organic material in the insulation layer, so that the stress generated in the process of bending the flexible substrate may be reduced, and the insulation layer is prevented from being broken by undue stress. Thus, the flexible substrate manufactured by the above method is of high reliability and good bendability.

The present disclosure further provides a display device including the flexible substrate according to any one of the above embodiments. In the above embodiments, the flexible substrate is of high reliability and good bendability, and thus the display device is of high reliability and good bendability.

It is appreciated that those skilled in the art may modify and improve the present disclosure without departing from the spirit and principle of the present disclosure. As a result, if those modification and improvement falls within the scope of claims and the equivalence thereof, those modification and improvement fall within the scope of the present disclosure.

What is claimed is:
1. A flexible substrate comprising:
   a flexible base;
   a plurality of insulation layers on the flexible base, and
   a plurality of functional units, separately arranged on the flexible base, each of the plurality of functional units comprising a thin film transistor (TFT) and a storage capacitor which is electrically connected to the TFT;

wherein the plurality of insulation layers comprises a plurality of via holes, each of the plurality of via holes in the plurality of insulation layers are filled with an organic material;

wherein the plurality of insulation layers comprises an inorganic buffer layer, a gate insulation layer, and a passivation layer which are overlapped on one another, and the passivation layer is arranged to be farthest to the flexible base among the plurality of insulation layers;

wherein the plurality of via holes comprises a plurality of first via holes and a plurality of second via holes, the plurality of first via holes are arranged between every two adjacent ones of the plurality of functional units and between the TFT and the storage capacitor in each of the plurality of functional units, each of the plurality of first via holes penetrates through each of the inorganic buffer layer, the gate insulation layer, and the passivation layer; and wherein each of the plurality of second via holes penetrates through the passivation layer in a thickness direction, and an orthographic projection of each of the plurality of second via holes on the flexible base is within an orthographic projection of the corresponding one of the plurality of functional units on the flexible base.

2. The flexible substrate according to claim 1, further comprising:
a planarization layer on the passivation layer, wherein each of the plurality of first via holes and each of the plurality of second via holes are filled with a material of the planarization layer.

3. The flexible substrate according to claim 1, further comprising a pixel definition layer and a light-emitting unit, on a planarization layer on the passivation layer,
wherein the light-emitting unit comprises an anode layer, a light-emitting layer, and a cathode layer, which are overlapped on one another, the pixel definition layer is arranged around the anode layer and the light-emitting layer, and the light-emitting layer comprises at least one organic light-emitting element.

4. The flexible substrate according to claim 3, further comprising:
a plurality of third via holes in the planarization layer,
wherein the plurality of third via holes and the plurality of first via holes between every two adjacent ones of the plurality of functional units are in one-to-one correspondence, each of the plurality of third via holes and each of the plurality of first via holes between every two adjacent ones of the plurality of functional units are filled with a material of the pixel definition layer arranged on the planarization layer, wherein an orthographic projection of each of the plurality of third via holes on the flexible base completely overlaps with an orthographic projection of the corresponding one of the plurality of first via holes between every two adjacent ones of the plurality of functional units on the flexible base.

5. The flexible substrate according to claim 4, wherein each of the plurality of functional units and each of the plurality of first via holes between the TFT and the storage capacitor in each of the plurality of functional units are arranged on a region corresponding to the anode layer.

6. The flexible substrate according to claim 3, further comprising:

a packaging layer on the light emitting unit, comprising alternately arranged organic layers and inorganic layers.

7. The flexible substrate according to claim 1, wherein the plurality of insulation layers further comprises an inter-layer insulation layer arranged between the gate insulation layer and the passivation layer.

8. The flexible substrate according to claim 1, further comprising:
an organic buffer layer, arranged between the flexible base and the plurality of insulation layers.

9. The flexible substrate according to claim 1, wherein each of the plurality of via holes is of a circular, elliptical or polygonal shape.

10. The flexible substrate according to claim 1, wherein the flexible base is made of one or more materials selected from the group consisting of polyimide, polycarbonate, polyacrylate, polyetherimide, polyethersulfone, polyethylene terephthalate, and polyethylene naphthalate.

11. A method for manufacturing the flexible substrate according to claim 1, comprising:
forming at least one insulation layer on the flexible base; and
forming a via hole in the at least one insulation layer, and filling the via hole with an organic material.

12. A display device comprising the flexible substrate according to claim 1.

13. The display device according to claim 12, wherein the flexible substrate further comprises:
a planarization layer on the passivation layer, wherein each of the plurality of first via holes and each of the plurality of second via holes are filled with a material of the planarization layer.

14. The display device according to claim 12, wherein the flexible substrate further comprises a pixel definition layer and a light-emitting unit, on a planarization layer on the passivation layer,
wherein the light-emitting unit comprises an anode layer, a light-emitting layer and a cathode layer which are overlapped on one another, the pixel definition layer is arranged around the anode layer and the light-emitting layer, and the light-emitting layer comprises at least one organic light-emitting element.

15. The display device according to claim 14, wherein the flexible substrate further comprises:
a plurality of third via holes in the planarization layer,
wherein the plurality of third via holes and the plurality of first via holes between every two adjacent ones of the plurality of functional units are in one-to-one correspondence, each of the plurality of third via holes and each of the plurality of first via holes between every two adjacent ones of the plurality of functional units are filled with a material of the pixel definition layer arranged on the planarization layer, wherein an orthographic projection of each of the plurality of third via holes on the flexible base completely overlaps with an orthographic projection of the corresponding one of the plurality of first via holes between every two adjacent ones of the plurality of functional units on the flexible base.

16. The display device according to claim 15, wherein each of the plurality of functional units and each of the plurality of first via holes between the TFT and the storage capacitor in each of the plurality of functional units are arranged on a region corresponding to the anode layer.

17. The display device according to claim 14, wherein the flexible substrate further comprises a packaging layer on the light-emitting unit, comprising alternately arranged organic layers and inorganic layers.

18. The display device according to claim 12, wherein the plurality of insulation layers further comprises an inter-layer insulation layer arranged between the gate insulation layer and the passivation layer, and the flexible substrate further comprises an organic buffer layer, arranged between the flexible base and the plurality of insulation layers.

19. The display device according to claim 12, wherein each of the plurality of via holes is of a circular, elliptical, or polygonal shape.

20. The display device according to claim 12, wherein the flexible base is made of one or more materials selected from the group consisting of polyimide, polycarbonate, polyacrylate, polyetherimide, polyethersulfone, polyethylene terephthalate, and polyethylene naphthalate.

* * * * *